US005398398A

United States Patent [19]

Williams et al.

[11] Patent Number: 5,398,398

[45] Date of Patent: Mar. 21, 1995

[54] METHOD OF PRODUCING A SUPERCONDUCTING JOINT WITH NIOBIUM-TIN

[75] Inventors: John E. C. Williams, Wayland; Alexander Zhukovsky, Brighton; Ronald De Rocher, Gloucester, all of Mass.

[73] Assignee: Massachusetts Institute of Technology, Cambridge, Mass.

[21] Appl. No.: 179,401

[22] Filed: Jan. 10, 1994

Related U.S. Application Data

[63] Continuation of Ser. No. 920,114, Jul. 24, 1992, Pat. No. 5,290,638.

[51] Int. Cl.[6] .............................................. H01L 39/24

[52] U.S. Cl. ....................................... 29/599; 505/925; 505/926; 505/927

[58] Field of Search .................. 29/599; 505/925, 926, 505/927

[56] References Cited

U.S. PATENT DOCUMENTS

| | | | |
|---|---|---|---|
| 3,200,368 | 8/1965 | Stekly et al. | 29/599 X |
| 3,527,876 | 9/1970 | Karvonen et al. | 29/599 X |
| 4,385,277 | 5/1983 | Hanley . | |
| 4,904,949 | 2/1990 | Wilson . | |
| 4,943,781 | 7/1990 | Wilson et al. . | |
| 4,968,915 | 11/1990 | Wilson et al. . | |
| 5,017,882 | 5/1991 | Finlan . | |
| 5,290,638 | 3/1994 | Williams et al. | 505/925 |

FOREIGN PATENT DOCUMENTS

| | | | |
|---|---|---|---|
| 64-673 | 1/1989 | Japan . | |
| 2-186575 | 2/1990 | Japan | 505/925 |
| 2-106866 | 4/1990 | Japan . | |
| 2-207471 | 8/1990 | Japan | 29/599 |
| 3-55781 | 3/1991 | Japan | 29/599 |
| 3-208279 | 9/1991 | Japan . | |
| 2-132002 | 6/1984 | United Kingdom . | |
| 2174247A | 10/1986 | United Kingdom . | |
| 2174248A | 10/1986 | United Kingdom . | |
| WO80/02084 | 10/1980 | WIPO | 29/599 |

OTHER PUBLICATIONS

J. E. C. Williams et al. "600 MHz Spectrometer Magnet" IEEE Trans. Mag. 25(2), 1767–1770 (Mar., 1989).

*Primary Examiner*—Carl J. Arbes

*Attorney, Agent, or Firm*—Choate, Hall & Stewart

[57] ABSTRACT

A superconducting joint includes a niobium-tin superconducting composite member, a niobium-tin superconducting wire diffusion bonded to the superconducting composite, a spacer diffusion bonded to the superconducting wire, a support diffusion bonded to the spacer and a superconducting member in electrical contact with the superconducting composite. According to the method of the invention, a wire comprising unreacted niobium and tin is machined to form a tapered end having a first tapered surface exposing the wire interior and an opposing surface. A complementary spacer having the taper substantially similar to that of the wire is assembled with the wire so that the tapered wire and the tapered spacer in surface contact with one another such that the spacer occupies the area of the wire removed by machining and the exposed tapered surface remains still exposed. The wire/spacer assembly are positioned between a support plate and a composite member comprising unreacted niobium and tin such that the spacer is in surface contact with the support plate and the wire is in surface contact with the composite member thereby forming an assembled joint. Transverse pressure is applied to the assembled joint and the assembled joint is heated to form a superconducting phase and to diffusion bond the component elements of the assembled joint to one another. Lastly, a superconducting member is brought into electrical contact with an exposed face of the superconducting composite member.

22 Claims, 3 Drawing Sheets

METHOD OF PRODUCING A SUPERCONDUCTING JOINT WITH NIOBIUM-TIN

This application is a Continuation of U.S. patent application Ser. No. 07/920,114, filed Jul. 24, 1992, now U.S. Pat. No. 5,290,638, issueed Mar. 1, 1994, hereby incorporated by reference.

FIELD OF THE INVENTION

The present invention relates to superconducting joints and a method for their production. The invention more specifically relates to resistanceless joints for the joining of pairs of superconductor wire.

BACKGROUND OF THE INVENTION

High field superconducting magnets are desired for improved resolution and signal to noise in high resolution nuclear magnetic resonance (NMR) spectroscopy. Such high field magnets typically use niobium-tin superconducting material. A niobium-tin wire is wound into a coil in which the component niobium and tin are in the unreacted state. The niobiurn-tin wire preferably has a rectangular cross section because it provides a higher filling factor for the winding of a superconducting magnet. The coil is heated to approximately 700° C., thereby forming the superconducting intermetallic niobium-tin compound, $Nb_3Sn$.

These magnetic coils have two important characteristics: the magnetic field generated in the bore of the magnet has high homogeneity and is highly stable with time. High field stability is achieved by closing the circuit of the magnetic coil so that the current flows in a closed loop without resistance, i.e., is a superconductor. In order that the closed loop of the magnetic coil has no resistance, it is necessary that the joints closing the loop themselves have no resistance. Commonly used methods of preparing superconducting joints in metallic superconductors are inappropriate for use with intermetallic superconductors because the superconducting wire is thereby degraded and resistance is introduced into the loop.

John E. C. Williams et al. in "600 MHz Spectrometer Magnet" (*IEEE Trans. Mag.* 25(2), 1767 (1989)) have disclosed a superconducting joint as shown in FIG. 1 in which a round end of a niobium-tin wire 10 is diffusion bonded into the interior of a niobium-tin composite 12. The joint is completed by spot welding 13 of a niobium-titanium ribbon 14 to the outer surface of the niobium-tin composite. However, contact between the niobium-tin wire 10 and the niobium-tin composite 12 is not optimal because the area of contact between the wire and the composite is limited to only the perpendicular cross-section of the wire. Furthermore, wire with a rectangular cross-section can not be readily joined using this prior art superconducting joint.

It is the object of the present invention to provide a superconducting joint having superior electrical contact between pairs of superconducting wire in which at least one of the wires contains the superconductor niobium-tin.

It is a further object of the present invention to provide a hybrid niobium-tin/niobium-titanium superconducting joint that provides the processing flexibility of niobium titanium alloy with the desired magnetic properties of the niobium tin intermetallic compound.

SUMMARY OF THE INVENTION

The superconducting joint of the present invention includes a niobium-tin superconducting composite member, a niobium-tin superconducting wire diffusion bonded to the superconducting composite, a spacer diffusion bonded to the superconducting wire, a support diffusion bonded to the spacer and a superconducting member in electrical contact with the superconducting composite.

In another aspect of the invention, a superconducting joint includes a niobium-tin superconducting composite having at least one fiat surface. A tapered niobium-tin superconducting wire having a first opposing surface and a tapered surface exposing the interior of the superconducting wire is diffusion bonded to the fiat surface of the composite member through the exposed tapered surface. The exposed tapered surface of the superconducting wire is important to obtaining a superior superconducting joint because the taper exposes the interior of the wire and permits surface contact of the interior of the wire with the composite member. A tapered spacer complementary to the superconducting wire is provided whose taper is substantially similar to that of the superconducting wire. The spacer is diffusion bonded through a second tapered surface of the spacer to the first opposing surface of the superconducting wire. A support plate is diffusion bonded to a second opposing surface of the spacer and a superconducting member is in electrical contact with the niobium-tin superconducting composite member. In some embodiments described hereinunder the composite member may also be diffusion bonded to the support post.

By "complementary", as that term is used herein, it is meant that the taper of the wire and spacer are substantially similar and that the spacer occupies the area removed from the wire upon formation of the taper. The positioning of the spacer and the superconducting wire as disclosed above provides an assembly having substantially the same shape as the original whole wire.

By "diffusion bond", as-that term is used herein, it is meant a strong adhesive bond formed between two distinct materials as a result of atomic interdiffusion across an interface of the two materials. Diffusion is typically promoted by high temperatures and by compression which provides intimate contact across the interface.

The niobium-tin superconducting wire is typically a conducting tail from a superconducting magnet coil. In preferred embodiments, the niobium-tin superconducting wire includes filaments of niobium-tin superconductor in a metallic matrix. The matrix can be a tin alloy and is preferably bronze. The superconducting member is preferably niobium-titanium alloy. The niobium-tin superconducting composite member can be a pressed powder composite with a rectangular or square cross-section. The taper of the spacer and the superconducting wire is substantially similar and has a taper angle in the range of 1° to 5° and, preferably, 2° to 3°. The small taper angle is preferred because it provides a large cross-sectional contact area. Additionally, a large taper angle might exceed the coefficient of friction allowing the wire and spacer to slide apart during assembly. The superconducting wire and the spacer are positioned such that the exposed tapered surface of the superconducting wire and a second opposing surface of the spacer are substantially parallel.

For improved protection of the superconducting joint from mechanical shock, the support plate may include a channel for receiving the spacer and superconducting wire. The support plate can be made from non-magnetic refractory materials. For additional protection against damage, the joint can be impregnated with a curable epoxy resin.

In another aspect of the invention, a method for producing a superconducting joint is provided. According to the method of the invention, a wire comprising unreacted niobium and tin is machined to form a tapered end with a first opposing surface and a tapered surface exposing the wire interior. The exposed tapered surface may be aligned flush with the extended length of the wire prior to further assembly. A complementary spacer is provided with a second tapered surface and a second opposing surface which has a taper substantially similar to that of the wire. A composite member comprising unreacted niobium and tin and a support plate are also provided. The spacer and wire are complementarily assembled such that the first opposing surface of the wire and the second tapered surface of the spacer are in surface contact with one another. The wire/spacer assembly are positioned between the support plate and the composite member such that the second opposing surface of the spacer is in surface contact with the support plate and the exposed tapered surface of the wire is in surface contact with the composite member. The wire and spacer are positioned such that the exposed tapered surface and second opposing surface are substantially parallel. The order of assembly of the elements, that is, the tapered spacer, support post, tapered wire and composite member, is not limited to that described herein. Assembly of the elements can be carried out in any order that achieves the above-disclosed relative positions for the elements.

Transverse pressure is applied to the assembled elements which are then heated to form the superconducting compound $Nb_3Sn$ and to diffusion bond the component elements to one another. Transverse pressure may be applied to the assembled elements using any conventional method. Lastly, a superconducting member is brought into electrical contact with the superconducting composite member, thereby forming a superconducting joint.

In preferred embodiments, assembly of the component elements and application of transverse pressure is facilitated by the use of a clamp. The clamp includes a clamp body and a backing plate secured together by fastening means. The elements are assembled in the clamp body as described above and the backing plate is secured thereto by use of fasteners passing through aligned apertures in the clamp body and backing plate. Transverse pressure can be applied to the assembled elements by screwing or bearing down on the fasteners.

Thus assembled in the clamp, the elements can be heated to form the superconducting phase. To this end, the clamp is preferably made of a refractory material capable of withstanding high temperatures and is lined with refractory insulation such as mica to prevent adhesion of the assembled elements to the clamp. In a preferred embodiment, the fasteners are made from a material, such as Hastalloy, which has a lower coefficient of expansion than the stainless steel of the clamp so that during the heat treatment the clamp exerts an increased pressure on the assembled elements.

In other preferred embodiments, the superconducting member is spot welded onto the composite member. The greater the number of spot welds, the greater the current density of the joint. Typically, 40–60 spot welds are made per 3.8 cm length of superconducting member. Increased current density can be achieved by electrically contacting a plurality of superconducting members to the composite member.

The superconducting joint of the present invention allows for a greater area over which the niobium tin composite member is in electrical contact with the exposed surface of the niobium tin wire, thereby improving the current carrying capacity of the joint. The superconducting joint has been tested up to 450 A in fields of 3 Tesla. The present invention provides a superior joint by applying pressure across the niobium tin composite member/wire interface during the heat treatment.

BRIEF DESCRIPTION OF THE DRAWING

The features and advantages of the present invention will become apparent with reference to the Drawing in which.

DESCRIPTION OF THE PREFERRED EMBODIMENT

Figure 1:
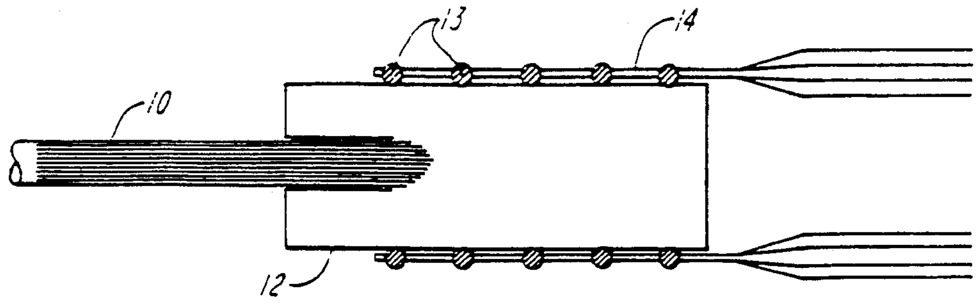
FIG. 1 (PRIOR ART)
FIG. 1 is a schematic illustration of a prior art superconducting joint.

A superconducting joint capable of joining a pair of superconducting wires without resistance is described. In the preparation of high field NMR magnets, at least one of the superconducting wires to be joined is a niobium-tin superconductor. The second wire is typically niobium-titanium alloy. The use of both superconducting materials in the superconducting joint is known as a hybrid joint.

A typical superconducting magnetic coil consists of a primary wire composed of a metal matrix containing a large number of fine niobium filaments or, alternatively, a niobium/metal matrix composite. The matrix metal must contain tin to permit formation of the superconducting phase. The cross-sectional geometry of the primary wire can be round or rectangular. The primary wire is wrapped in a layer of tantalum and around that is wrapped a layer of copper. The entire assembly is processed by swaging and drawing. The drawn wire is then insulated by a braid of glass fiber. A coil is wound from a length of wire leaving two tails extending from the coil. The superconducting niobium-tin compound $Nb_3Sn$ is formed by heating the coil for several hundreds of hours at a temperature in the range of 700° C.

The superconducting joint of the present invention is prepared from a primary wire having a rectangular or square cross-section. Therefore, the tail of a primary wire having a round cross-section must be shaped into a rectangular form or surrounded so as to approximate a rectangular form before use in accordance with the present invention. Referring to the Figures in the Drawing, the assembly of the superconducting joint will be described in detail. Throughout the description, like-numbered elements represent the same elements.

Figure 2:
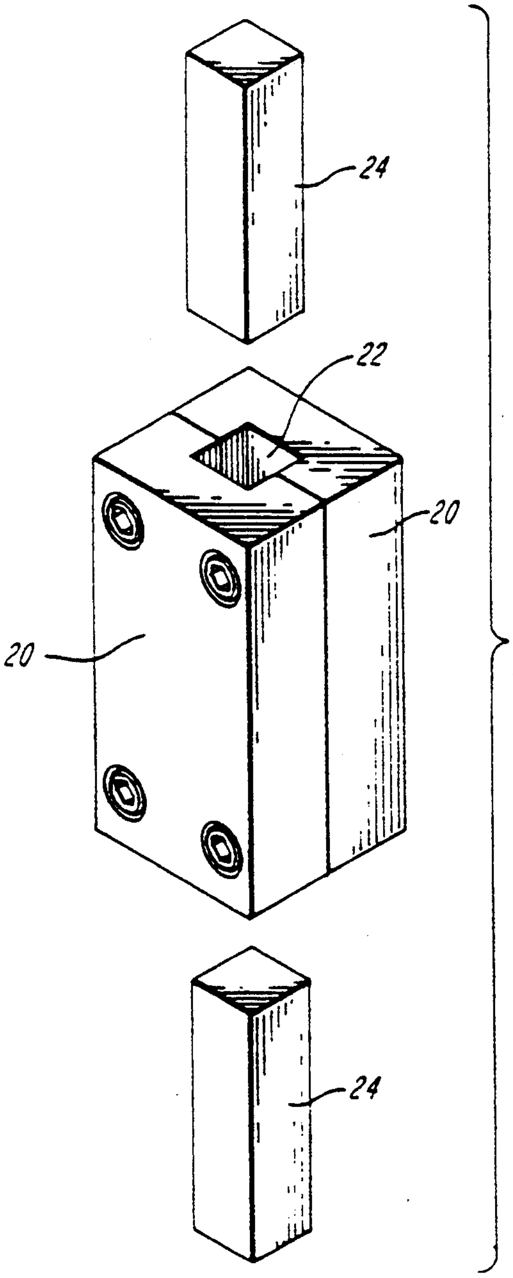
FIG. 2 is an illustration of a mold used in preparation of a niobium-tin composite member.

A composite member is prepared by powder compaction of niobium and tin powders. Any conventional powder compaction technique is within the scope of the invention provided that it does not prematurely convert the niobium and tin powders into the superconducting compound. Cold isostatic pressing is a preferred method. Niobium and tin powders are mixed in the ratio of 10 parts by weight of niobium to 1 part by weight tin. A mold such as that shown in FIG. 2 consisting of two stainless steel shells 20 bolted together can be used. The mold forms a square or rectangular cross-section having open end 22. Two pistons 24, of tool grade steel, of the same cross-section fit snugly into the mold. Before use, the inner surfaces of the mold are sprayed with a release agent. A quantity of the mixed powder is poured into the mold and the pistons are pressed into it under high pressure. The quantity of powder and pressing parameters are selected to produce a pressed powder ingot of a predetermined length. A typical ingot has the dimension of 9 mm×9 mm×3.8 cm, however, any reasonable dimension is within the scope of the present invention.

Figure 3:
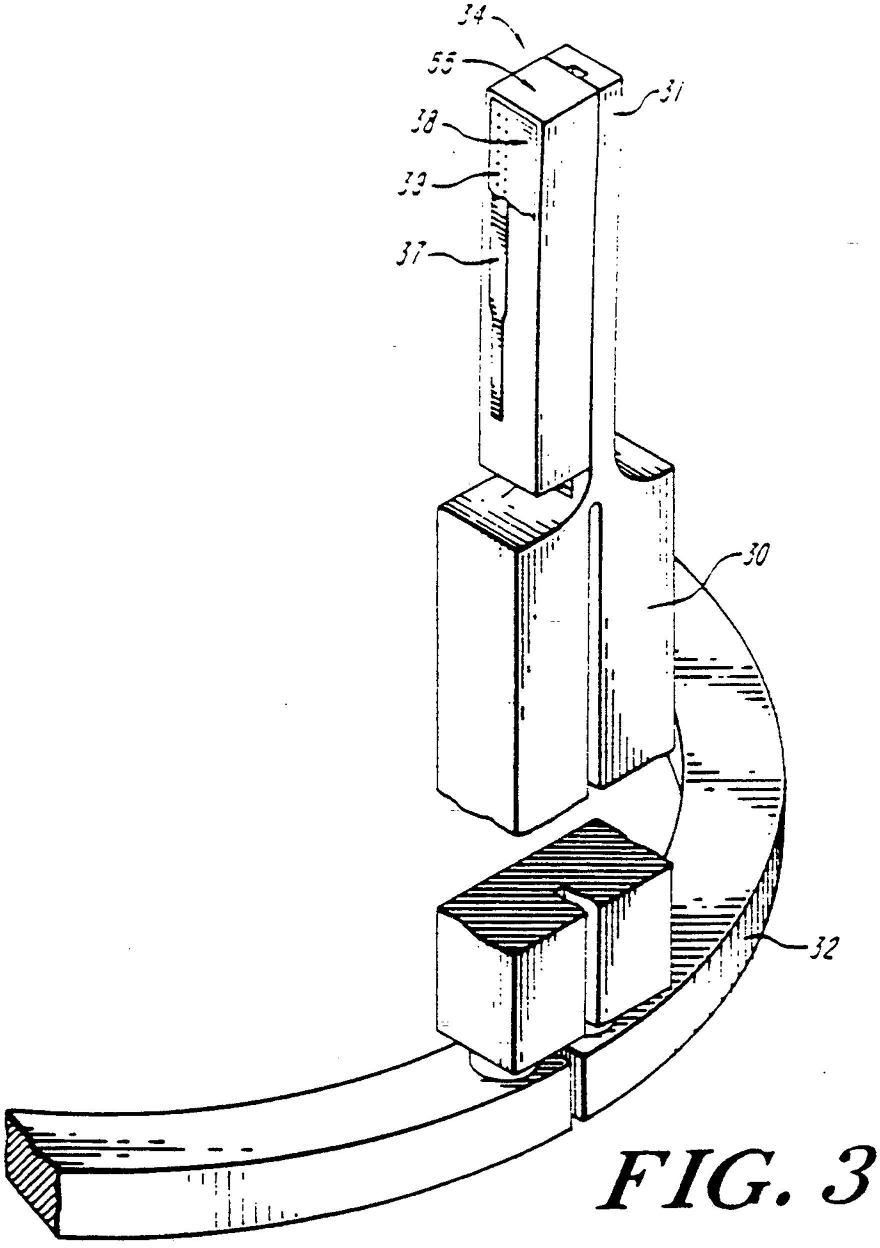
FIG. 3 is a schematic illustration of a superconducting joint of the present invention.

Referring to FIG. 3, a post 30 is provided which contains an integral support plate 31. The post 30 extends away from the end of coil form 32 into a low field region. Typically, a low field region of less than 3 Tesla is chosen for the location of the superconducting joint to improve the critical current of the joint. The post is made from a non-magnetic refractory material, such as titanium-vanadium-aluminum alloy. The end of the post is machined so that a superconducting joint 34 can be secured to the post in any convenient way.

Figure 4A:
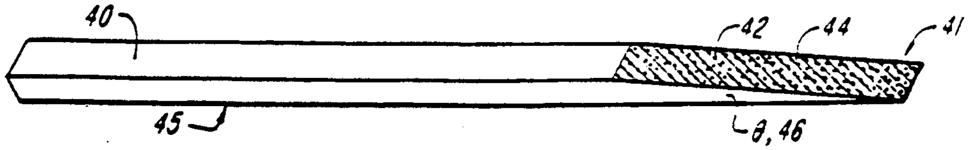
FIG. 4 is an illustration of a tapered superconducting wire used in the assembly of a superconducting joint in (a) unaligned and (b) aligned positions.
Figure 4B:
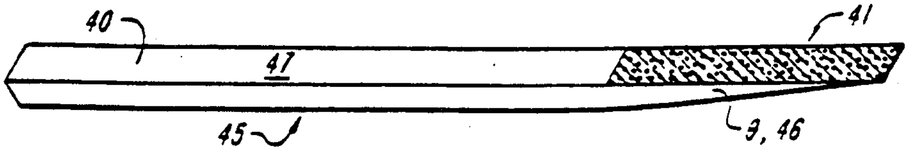

The niobium-tin wire is prepared by diagonally machining a tapered face on the end of the wire which cuts across all the niobium filaments or across the niobium-tin composite surface. The machined wire 40 shown in FIG. 4*a* clearly depicts a tapered surface 41 having exposed niobium filaments 42 in a metal matrix 44 and a first opposing surface 45. A taper angle 46 (Θ) is in the range of 1° to 5° and preferably 2° or 3°. The low angle of the taper permits exposure of a large cross-sectional area. Further, the diagonal cut permits the niobium filaments to be brought into direct contact with the niobium-tin composite member. The exposed surface can be lightly etched with nitric acid to expose niobium 5–10 μm above the matrix surface. The wire can be bent after machining, as shown in FIG. 4*b*, so that the tapered exposed surface 41 is aligned flush with the extended length 47 of the wire.

A spacer is also machined having a shape complementary to that of the tapered end of the wire. The spacer may be made of any material compatible with the niobium-tin wire, such as copper, bronze or stainless steel. In most preferred embodiments, the spacer is prepared from the same niobium tin wire as used in the winding of the magnetic coil.

Figure 5:
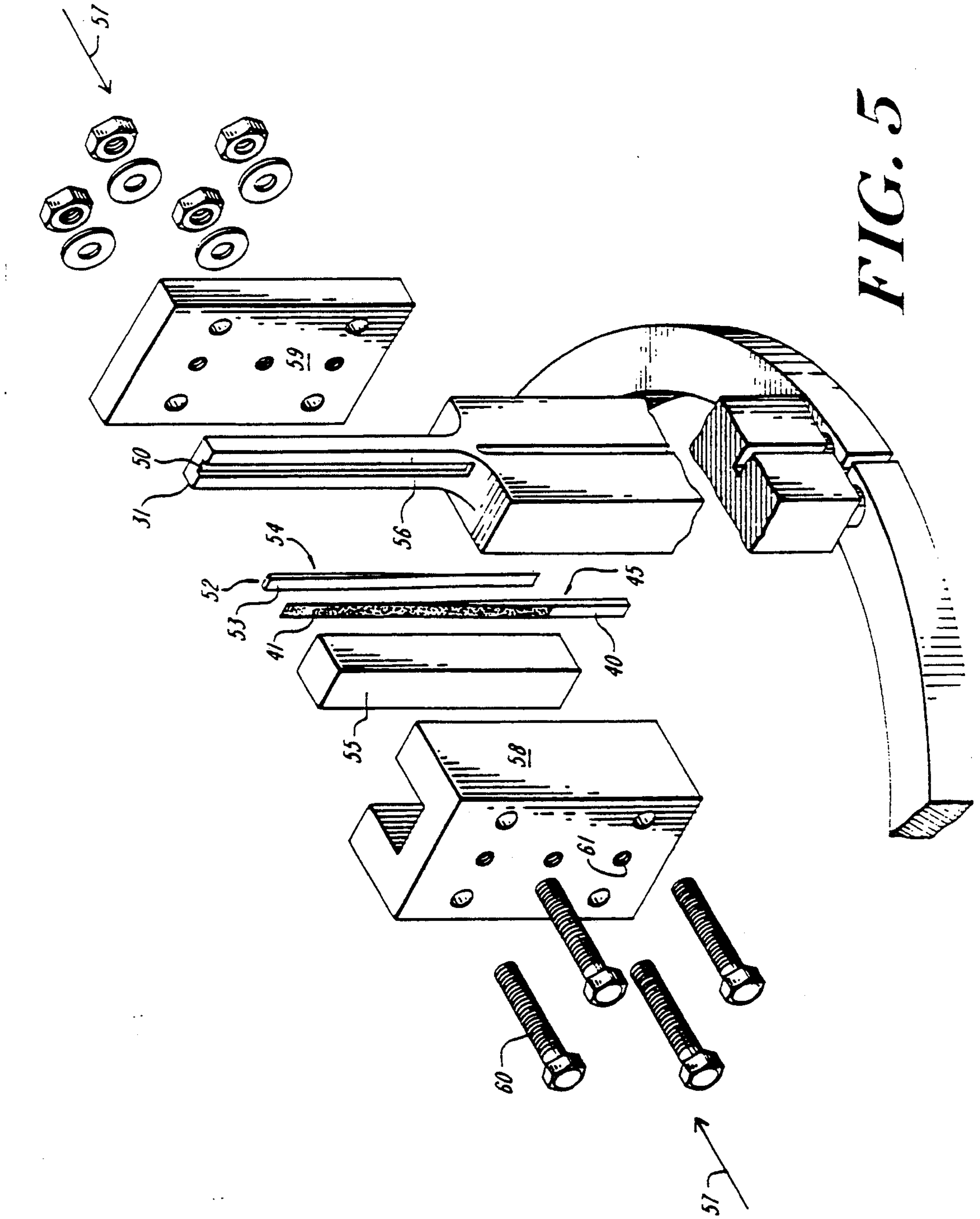
FIG. 5 is an illustration of the assembly of a superconducting joint according to the method of the invention.

Referring to FIG. 5, the wire 40 and spacer 52 are positioned adjacent to the support plate, however, improved support and resistance to damage from mechanical shock is obtained when the wire and spacer are assembled in a channel 50 provided in the support plate 31. The spacer 52 having a second tapered surface 53 and a second opposing surface 54 is positioned between the wire 40 and the support plate 31 such that the tapered face 41 of the wire is directed away from the support post. The first opposing surface 45 of the wire and the second tapered surface 53 of the spacer are in surface contact with one another. The spacer 52 occupies the gap created by the taper of the wire and is used to back the wire 40 to create a surface parallel to a face of a composite member 55. The assembled wire and spacer should not lie in the channel below a surface 56 of the support plate since surface contact of the wire with the composite member 55 is then not possible. In preferred embodiments, the assembled wire and spacer rise 0.003″–0.005″ (or 75–125 μm) above the surface 56 of the support plate. The composite member 55 is positioned in surface contact with the exposed tapered surface 41 of the wire 40. Although the composite member may not rest against the spacer during assembly, it has been determined that during the heat treatment the composite member expands and butts up against the surface 56 of the support plate. Assembly of the elements need not occur in the exact order described above, however, the relative position of the elements is as described above.

As of yet, the assembled elements are not superconducting. A high temperature heat treatment is necessary in order to convert the niobium and tin of wire 40 and composite member 55 into the superconducting compound $Nb_3Sn$. The treatment of the assembled elements occurs advantageously simultaneously with the treatment of the magnetic coil itself. The details of the heat treatment are well known in the prior art, see, for example, J. E. C. Williams et al. in *IEEE Trans. Mag.* 25(2), 1767 (1989).

The individual elements need to be in close surface contact so that diffusion bonding is optimized during heat treatment. To this end, transverse pressure is applied to the assembled elements directed along arrows 57. Any conventional means of providing transverse pressure to the joint is within the scope of the invention. In preferred embodiments, a clamp as depicted in FIG. 5 is used. A clamp body 58 and backing plate 59 are made of a refractory material. Fasteners 60, also of a refractory material, are used to hold the clamp parts together. Fasteners 60 may be bolts, screws or pins or any other fastening means. Transverse pressure is applied by screwing or pinning down fasteners 60. Additional pressure results when the fasteners 60 are made of Hastalloy, molybdenum, tungsten or any other material with high strength at high temperature and low coefficient of expansion and the clamp parts 58 and 59 are made of stainless steel. Upon heating, the clamp parts expand and are held in place by the fasteners, thereby exerting force on the assembled elements. The ability to apply transverse pressure to the assembled elements during heating is an important step in obtaining a superior superconducting joint.

Where the clamp parts press directly on the composite member 55 or the support plate 31, a refractory insulator such as mica is used as an interface to prevent bonding. Further, stainless steel shims (not shown) may be used to create a snug fit for the composite member 55 in the clamp body 58. Both the clamp body 58 and the backing plate 59 are equipped with threaded holes 61, so that jacking screws (not shown) may be inserted to remove the clamp parts from the joint after heat treatment.

After heat treatment, the unreacted niobium and tin of the composite and wire have been converted to the superconducting phase. Referring to FIG. 3, the superconducting niobium-tin composite member 55 is diffusion bonded to the niobium-tin wire 40 (not shown), both of which now contain the superconducting compound $Nb_3Sn$. The superconducting wire 40 is further diffusion bonded through the spacer 52 (not shogun) to the support plate 31. The support post should contain an alloy or metal such as titanium capable of diffusion bonding with the spacer and composite member. At this point the joint can be bonded to the support plate with an epoxy resin to further secure the joint.

Any or all of the three accessible surfaces of superconducting composite member 55 are now cleaned and lightly polished in preparation for electrically contacting a superconducting member 37 onto the superconducting composite member 55. In preferred embodiments, the superconducting member 37 is a niobium-titanium superconducting wire.

Monofilament niobium-titanium wires suitable for use in the superconducting joint of the invention are prepared as follows. A copper clad wire with a copper:superconductor ratio of about 1.5:1 and an overall diameter of about 1.2 mm is cut into suitable lengths (approx. 30 cm). The wire is flattened by rolling to a thickness of 0.25 mm over a length of 3.8 cm at one end. The copper cladding is then etched away from the flattened end to expose flattened spades of niobium-titanium.

FIG. 3 shows the assembly of the completed superconducting joint 34. The flattened superconducting member 37 is laid on a polished surface of the superconducting composite member 55. Optionally, a thin sheet 38 of conductive metal such as stainless steel is laid over the superconducting member 37. A thin sheet 38 of niobiurn-tin deposited on Hastalloy has also been successfully inserted between the superconducting composite member 55 and the superconducting wire 37. However, it is preferred that no metallic sheet be used to create the spot welds. A spot weld 39 is made through the superconducting member 37 into the superconducting composite member 55. The welding energy is adjusted so that a strong weld is obtained without burning and is dependent upon the materials used and size of the joint. In the joint described above, a welding energy of approximately 10–13 J was used. The spot welding process is repeated many times over the length of the flattened superconducting member 37, each spot being distanced from its neighbor by an amount equal to the diameter of the discoloration of the spot. Typically 40–60 spot welds can be made over a 3.8 cm length of superconducting member 37. Generally, the critical current capacity of each spot weld 39 is 1 Ampere. Therefore, since as many as three superconducting members can be spot welded to the three exposed faces of the superconducting composite member, critical current of up to 450 A are theoretically possible in a 3 Tesla field.

Lastly, an epoxy resin may be applied to the completed joint for added strength and mechanical support. For this purpose, the joint is advantageously heated under a lamp so that the resin runs easily into the interstices of the joint.

The electrical contact of the superconducting member to the superconducting composite member can be stripped and remade. After stripping, the surface of superconducting composite member 55, must be repolished and cleaned. The spot welding process can then be repeated.

The hybrid joint of the present invention allows the joint to be finished with a superconducting niobium-titanium wire. Niobium-titanium is a soft, ductile metal and can be processed with standard metal-working techniques. Hence, it is possible to remove and replace a magnetic coil without destruction of the superconducting joint.

A superconducting joint as described above has been successfully incorporated into the superconducting magnet of a 750 MHz NMR magnet. It will be apparent to those skilled in the art that the invention may be applied to superconducting joints for other applications.

What is claimed is:

1. A method for preparing a superconducting joint for joining a pair of superconducting wires, comprising the steps of:
(a) machining a wire comprising unreacted niobium and tin;
(b) providing a spacer;
(c) providing a composite member comprising unreacted niobium and tin;
(d) assembling in any order the wire, spacer, and composite member such that the wire is in surface contact with the composite member and the spacer is in surface contact with the wire;
(e) applying transverse pressure to the assembled elements of step (d);
(f) heating the assembled elements under transverse pressure to produce a superconducting niobium-tin phase in the composite member and the wire, and to diffusion bond the assembled elements to one another where the elements are in surface contact;
(g) electrically contacting a superconducting member to the composite member.

2. A method for preparing a superconducting joint for joining a pair of superconducting wires comprising:
(a) machining a wire comprising unreacted niobium and tin, such that the wire has a tapered end having a first tapered surface exposing the wire interior and a first opposing surface;
(b) providing a complementary spacer having a second tapered surface and a second opposing surface and having a taper substantially similar to that of the wire;
(c) providing a composite member comprising unreacted niobium and tin and having at least one flat surface;
(d) assembling in any order the wire, spacer, and composite element such that the first tapered surface of the wire is in surface contact with the flat surface of the composite member and the second tapered surface of the spacer is in surface contact with the first opposing surface of the wire;
(e) applying transverse pressure to the assembled elements of step (d) ;
(f) heating the assembled elements under transverse pressure to produce a superconducting niobium-tin phase in the composite member and the wire and to diffusion bond the assembled elements to one another where the elements are in surface contact; and
(g) electrically contacting a superconducting member to the composite member.

3. The method of claims 1 or 2, further comprising a step of providing a support plate, and wherein the step (d) of assembling comprises assembling in any order the wire, spacer, composite element, and support such that the first tapered surface of the wire is in surface contact with the flat surface of the composite member, the second tapered surface of the spacer is in surface contact with the first opposing surface of the wire, and the second opposing surface of the spacer is in surface contact with the support plate.

4. The method of claims 1 or 2, wherein the composite member is a powder composite.

5. The method of claims 1 or 2, wherein the wire comprises free filaments of niobium in a tin-containing matrix.

6. The method of claims 1 or 2, wherein the superconducting member comprises niobium-titanium.

7. The method of claims 1 or 2, wherein the elements of step (d) are assembled and the transverse pressure of step (e) is applied using a clamp, the clamp having a clamp body for receiving the assembled joint and a backing plate for supporting the assembled joint in the clamp, the clamp body and backing plate secured together by fastening means.

8. The method of claim 7, wherein the fastening means comprises fasteners passing through aligned apertures in the clamp body and backing plate.

9. The method of claim 8, wherein the fasteners comprise a material selected from the group consisting of Hastalloy, molybdenum, and tungsten.

10. The method of claim 7, wherein the clamp body and backing plate comprise stainless steel.

11. The method of claim 7, wherein the clamp body and backing plate are lined with insulation to prevent bonding of the assembled elements to the clamp.

12. The method of claim 7, wherein the assembled elements are removed from the clamp by inserting jacking screws in threaded apertures in the clamp body and backing support.

13. The method of claims 1 or 2, wherein the step (g) of electrically contacting the superconducting member to the composite member comprises spot welding.

14. The method of claim 13, wherein approximately 40 to 60 spot welds are made over a length of approximately 3.8 cm.

15. The method of claims 1 or 2, wherein the superconducting member has a thickness within the range of approximately 0.005 to 0.02 inch (0.13 to 0.51 mm).

16. The method of claims 1 or 2, wherein a plurality of superconducting members are electrically contacted with the composite member.

17. The method of claims 1 or 2, further comprising a step of applying an epoxy resin to the assembled joint after heat treatment.

18. The method of claim 2, further comprising a step of aligning the exposed tapered surface of the wire prior to the assembling step (d) so that the exposed tapered surface of the wire is flush with the extended length of the wire.

19. The method of claim 2, wherein the wire and spacer are positioned in the assembly step (d) such that the exposed tapered surface of the wire and the second opposing surface of the spacer are substantially parallel.

20. The method of claim 2, further comprising a step of etching the exposed tapered surface of the wire after the machining of step (a) to expose niobium above a tin-containing surface.

21. The method of claim 3, wherein the wire and spacer are positioned in a channel of the support plate for additional support.

22. The method of claim 21 wherein the wire and spacer assembled in the channel extend beyond a support plate surface.

* * * * *

UNITED STATES PATENT AND TRADEMARK OFFICE

CERTIFICATE OF CORRECTION

PATENT NO. : 5,398,398

DATED : March 21, 1995

INVENTOR(S) : John E. C. William, et al.

It is certified that error appears in the above-indentified patent and that said Letters Patent is hereby corrected as shown below:

Column 1, line 27: please delete "C.,"; and insert therefor -- C, --.

Column 2, line 13: please delete "fiat"; and insert therefor -- flat --.

Column 2, line 16: please delete "fiat"; and insert therefor -- flat --.

Column 2, line 41: please delete "as-that"; and insert therefor -- as that --.

Column 3, line 23: please delete "wire/-"; and insert therefor -- wire/ --.

Column 6, line 68: please delete "shogun"; and insert therefor -- shown --.

Signed and Sealed this

Thirtieth Day of May, 1995

*Attest:*

Bruce Lehman

BRUCE LEHMAN

*Attesting Officer*

*Commissioner of Patents and Trademarks*